United States Patent
Alptekin et al.

(10) Patent No.: US 9,691,658 B1
(45) Date of Patent: Jun. 27, 2017

(54) CONTACT FILL IN AN INTEGRATED CIRCUIT

(71) Applicant: GLOBALFOUNDRIES INC., Grand Cayman (KY)

(72) Inventors: Emre Alptekin, Wappingers Falls, NY (US); Raghu Mangu, Wappingers Falls, NY (US); Cung D. Tran, Newburgh, NY (US); Domingo A. Ferrer, Fishkill, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/159,186

(22) Filed: May 19, 2016

(51) Int. Cl.
| | |
|---|---|
| H01L 21/768 | (2006.01) |
| H01L 23/522 | (2006.01) |
| H01L 23/532 | (2006.01) |
| H01L 21/3213 | (2006.01) |
| H01L 21/311 | (2006.01) |

(52) U.S. Cl.
CPC .. *H01L 21/76865* (2013.01); *H01L 21/31138* (2013.01); *H01L 21/32139* (2013.01); *H01L 21/76846* (2013.01); *H01L 21/76877* (2013.01); *H01L 23/5226* (2013.01); *H01L 23/53257* (2013.01); *H01L 23/53266* (2013.01)

(58) Field of Classification Search
CPC ................................................ H01L 21/76865
USPC ........................................................ 438/672
See application file for complete search history.

(56) References Cited

U.S. PATENT DOCUMENTS

| | | | |
|---|---|---|---|
| 5,929,526 A | 7/1999 | Srinivasan et al. | |
| 6,054,365 A * | 4/2000 | Lizotte | H01L 21/763 257/E21.572 |
| 6,821,864 B2 * | 11/2004 | Chan et al. | H01L 21/3081 257/E21.232 |
| 7,078,312 B1 * | 7/2006 | Sutanto et al. | C23C 16/045 257/E21.252 |
| 7,795,138 B2 * | 9/2010 | Chiang et al. | C23C 14/046 438/629 |
| 7,964,504 B1 * | 6/2011 | Shaviv et al. | C23C 14/046 257/E21.17 |
| 7,994,060 B2 | 8/2011 | Burns et al. | |
| 8,183,146 B2 * | 5/2012 | Feng et al. | H01L 21/743 257/E21.537 |
| 2002/0031901 A1 | 3/2002 | Sadjadi et al. | |
| 2003/0134510 A1 * | 7/2003 | Lee et al. | C25D 5/022 438/674 |

(Continued)

*Primary Examiner* — George Fourson, III
(74) *Attorney, Agent, or Firm* — Scully Scott Murphy and Presser; Frank Digiglio (57) ABSTRACT

A method of forming an electrical contact in an integrated circuit, and an integrated circuit are disclosed. In an embodiment, the integrated circuit comprises a substrate, an insulating layer, and a metal layer. An opening is formed through the insulating layer to expose an active area of the substrate. The metal layer forms a cusp at a top end of the opening, narrowing this end of the opening. In embodiments, the method comprises depositing a conductive layer in the opening to form a liner, applying a filler material inside the opening to protect a portion of the liner, removing the cusp to widen the top of the opening while the filler material protects the portion of the liner covered by this material, removing the filler material from the opening, re-lining the opening, and filling the opening with a conductive material to form a contact through the insulating layer.

15 Claims, 7 Drawing Sheets

(56) References Cited

U.S. PATENT DOCUMENTS

| | | | |
|---|---|---|---|
| 2007/0059925 A1* | 3/2007 | Choi et al. | H01L 21/76843 438/640 |
| 2008/0124885 A1* | 5/2008 | Lin et al. | H01L 28/91 438/386 |
| 2015/0024592 A1* | 1/2015 | Chandrashekar et al. | H01L 21/67207 438/675 |

* cited by examiner

CONTACT FILL IN AN INTEGRATED CIRCUIT

BACKGROUND

The present invention relates to the formation of contacts through insulating layers in integrated circuits, and more particularly, the invention relates to eliminating the development of voids in the contacts when openings in the insulating layer are filled with metal to form the contacts.

In a typical integrated circuit fabrication technology, after transistors are formed on a semi-conductor substrate, a layer of dielectric material is used to coat the surface of the transistors to physically and electrically insulate them. Once this dielectric material is deposited, openings are etched through the dielectric material to the underlying semiconductor substrate. Conductive material is deposited into these openings in order to make electrical contact to the substrate surface. These openings filled with conductive material are called contacts.

As the density of the active devices formed on the substrate increases, the width of the contacts decreases. However, the thickness of the insulating layer through which the contacts extend can only be decreased to a certain minimum thickness. An insulating layer that is too thin results in an intolerably high interlevel capacitance, which ties up otherwise available conduction carriers. As dimensions continue to be scaled down to the submicron and nanometer level, the width of the contacts decreases in size but the depth of the contacts (through an insulating layer) remains the same. As a result, the aspect ratio of the contacts, and of the openings in which the contacts are formed, increases as circuitry becomes more densely packed.

The contact fill, which commonly uses tungsten, gets more challenging together with contact dimensions scaling down, and the need for liner silicide to achieve low Rcontact. Mostly due to an overhang of metal at the top of the opening in which the contact is made, there is a formation of a large void, referred to as a key hole, in the contact, later causing a tungsten contact-to-copper contact reliability and/or open issue.

SUMMARY

Embodiments of the invention provide a method of forming an electrical contact through an insulating layer in an integrated circuit, and an integrated circuit having a contact through an insulating layer of the circuit.

In embodiments of the invention, the integrated circuit comprising a substrate, an insulating layer on the substrate, and a metal layer on the insulating layer. The substrate has an active area, and an opening is formed through the insulating layer to expose the active area of the substrate. The opening has a bottom end adjacent said active area and a top end spaced from said active area by a thickness of said insulating layer. The metal layer forms a cusp at the top end of said opening causing a narrowing of said opening at said top end. In embodiments of the invention, the method comprises depositing an initial conductive layer in the opening of the insulating layer to form a liner against a sidewall surface of the insulating layer and against said active area; applying a filler material inside said opening to protect a portion of said liner that is below a level of the cusp; removing the cusp to widen said opening while said filler material protecting said portion of said liner covered thereby; removing said filler material from said opening to expose said portion of said liner; re-lining said opening in the insulating layer with a further conductive layer; and filling the opening in the insulating layer with a conductive material to form an electrically conductive contact extending through the insulating layer.

In embodiments of the invention, applying said filler material inside said opening to protect said portion of said liner comprises filling said opening with said filler material above said level of said cusp; and recessing said filler material through etching to a level below said level of said cusp.

In embodiments of the invention, applying said filler material inside said opening to protect said portion of said liner comprises filling said opening with an organic planarizing underlayer filler, and the removing said filler material from said opening to expose said portion of said liner comprises conducting an organic underlayer ash to remove a portion of the organic underlayer fill.

In embodiments of the invention, the removing a portion of the filler material includes conducting an organic underlayer ash to remove a portion of the organic underlayer fill.

In embodiments of the invention, the metal layer forms a contact element on the active area of the substrate at the bottom end of the opening in the insulating layer, and the depositing an initial conductive layer in the contact includes depositing the initial conductive layer in said opening to form a contact area on said contact element.

In embodiments of the invention, the removing the cusp to avoid the pinch off of said opening in the while said filler material protecting said portion of said liner covered thereby comprises removing the metal layer on the insulating layer.

In embodiments of the invention, the depositing an initial conductive layer in the opening of the insulating layer to form a liner against a sidewall surface of the insulating layer includes forming a portion of the initial conductive layer over the metal layer, and the removing the metal layer on the insulating layer includes removing the portion of the initial conductive layer over the metal layer.

In embodiments of the invention, the filling the opening in the insulating layer with a conductive material includes depositing a portion of the conductive material on the insulating layer.

In embodiments of the invention, the method further comprises removing said portion of the conductive material on the insulating layer.

In embodiments of the invention, the removing the metal layer on the insulating layer includes using an etching process to remove the metal layer, including the cusp, on the insulating layer.

In embodiments of the invention, the initial conductive layer is Ti/TiN, the further conductive layer is Ti/TiN, and the conductive material is tungsten.

In embodiments of the invention, the integrated circuit comprises a semiconductor substrate having an active area; an insulating layer on the substrate and forming an opening through the insulating layer and above the active area of the substrate, the contact opening being defined by a surface of the insulating layer; a first conductive liner lining a lower portion of said surface of the insulating layer and including a bottom portion extending over the active area of the substrate; a second conductive liner, formed separately from the first conductive liner, lining an upper portion of said surface of the insulating layer; and a conductive material filling the opening in the insulating layer, from the bottom portion of the first conductive liner to a top of the insulating layer to form an electrically conductive contact extending through the insulating layer.

In embodiments of the invention, the integrated circuit further comprises a contact element between the active area of the substrate and the bottom part of the first conductive liner.

In embodiments of the invention, the first and second conductive liners are substantially contiguous.

In embodiments of the invention, the first and second conductive liners form a continuous liner in the opening of the insulating layer.

In embodiments of the invention, the second conductive liner extends to the top of the insulating layer.

Embodiments of the invention comprise filling the contact opening with a planarization material, and recessing that planarization material back to a certain level in the contact opening followed by a liner etch and organic underlayer ash. This is followed by a fresh TiN nucleation layer followed by the tungsten deposition.

DETAILED DESCRIPTION

The present description of embodiments of the invention relates to contacts between an interconnect layer to be formed and active areas within a silicon substrate, and to the structure and processes of forming tungsten plugs in such contacts, sometimes referred to as contact vias. However, it will be understood by those skilled in the art of integrated circuit fabrication that aspects of the invention may be applied to forming contacts between any two levels in an integrated circuit. For example, the invention may be applied to intermetal contacts.

Contacts to a silicon substrate are typically much deeper than metal-to-metal contacts. Insulating layers, such as borophosilicate glass (BPSG), are usually very thick in order to provide electrical isolation of devices such as capacitors and transistors. At the same time, the active areas to which contact must be made are constantly growing more narrow with each new generation of semiconductor chip. Accordingly, contacts made to silicon substrates may range in aspect ratio from about 2:1 to 8:1 and are expected to have even higher aspect ratios for future generation circuits.

These high-aspect ratio contact vias to the substrate are often formed by filing openings in the insulating layers with a CVD conductive material, such as tungsten. Prior to filling an opening, however, at least one initial conductive layer is often first deposited in the opening for improved contact resistance or diffusion barrier qualities.

Figure 1:
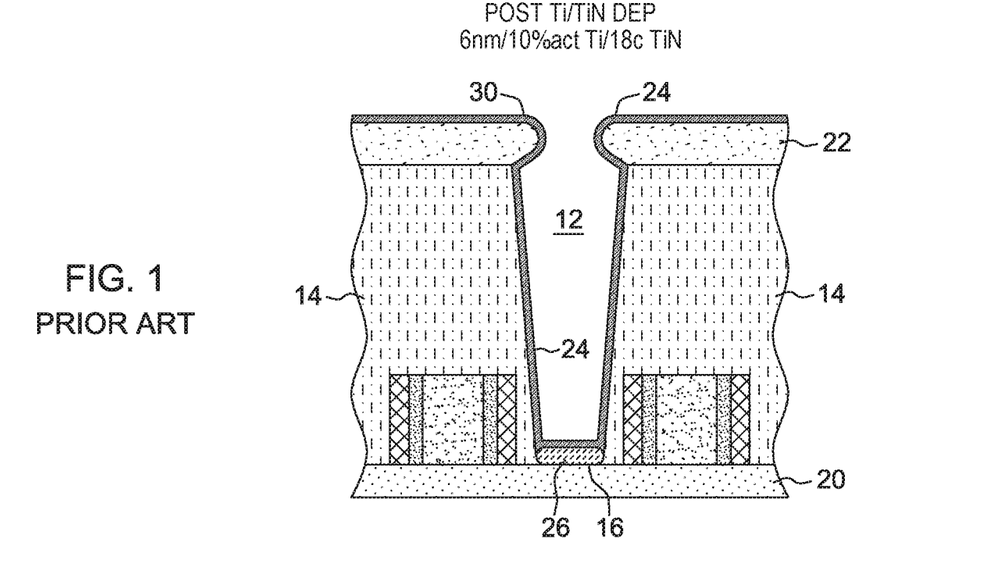
FIG. 1 is a schematic view of a prior art, partially fabricated contact in an integrated circuit.

FIG. 1 illustrates an opening 12, referred to as a contact opening, made through an insulating layer 14 down to an active area 16 of a semiconductor substrate 20. FIG. 1 also shows a metal layer 22 and a liner 24. Metal layer 22 is deposited on insulating material 14 and into contact opening 12, forming a contact element 26 at the bottom of the contact and over active area 16 of the substrate 20. As this metal layer is deposited, the metal layer forms a cusp 30 at a top of the contact opening. Liner 24 extends over contact element 26 and lines the sidewall of the contact opening 12. Above the insulating layer 14, liner 24 also extends over the metal layer 22.

The insulating layer 14 (e.g., BPSG) is usually very thick in order to provide electrical isolation of underlying devices such as capacitors and transistors. Contacts to the substrate 20 in dynamic random access memory (DRAM) cells are particularly deep, as the contact height is dictated by the height of adjacent cell capacitors. DRAM capacitors, in turn, are designed increasingly taller in order to provide adequate surface area for cell capacitance, despite shrinking available real estate.

At the same time, the active areas 16 to which contact must be made are constantly growing more narrow with each new generation of semiconductor chip, often confined between gate electrodes or word lines of a memory circuit, for example. Accordingly, metal-to-substrate contacts may range in aspect ratio from about 2:1 to 8:1.

Traditionally, contacts through thick insulating layers to silicon substrates have been formed by filling a hole through the insulating layer with a conductive plug which is deposited by chemical vapor deposition ("CVD"). The most common material used for this purpose is tungsten (W), for which CVD methods are well-developed, resulting in conformal deposition and filling of the contact opening without keyholes. At the same time, use of tungsten plugs for direct contact with silicon substrates presents a number of problems. Most of these problems may be addressed by first depositing an initial conductive layer, such as liner 24, within the contact opening prior to depositing the tungsten. The material typically used for this initial conductive layer is titanium, though other suitable materials are known.

The titanium serves several purposes. For instance, the titanium at the surface of the silicon may be annealed to form a silicide ($TiSi_2$ in its stoichiometric form) over the substrate surface. This significantly reduces the contact resistance between the active area and the tungsten plug through a better matching of energy levels. The process of forming the silicide (referred to as "silicidation") further reduces contact resistance by breaking up native oxide ($SiO_2$), an insulator which naturally forms at the silicon surface after the opening for the contact is formed. The layer of silicide also serves to prevent direct contact between the silicon substrate and tungsten. This is desirable since tungsten tends to interfere with electrical operations of transistors and other integrated devices. Furthermore, any titanium on the sidewalls of the contact improves adhesion, since CVD tungsten does not adhere well to the insulating layers, such as BPSG, in which the contact is formed.

Titanium and many other appropriate metals are generally deposited by physical vapor deposition ("PVD") or sputtering.

There is a natural tendency of PVD to more quickly grow at the corner of the opening in which the contact is formed than elsewhere. In some instance, the titanium layer 24 causes the cusp 30 to pinch off, closing the mouth of the opening 12 for the contact.

Figure 2:
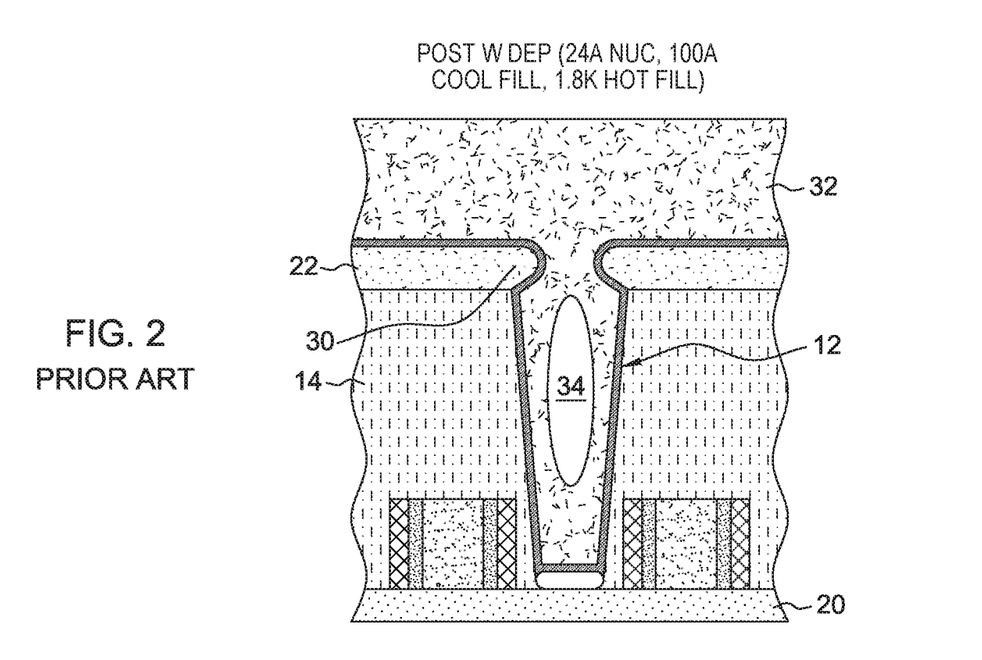
FIG. 2 is a schematic view showing the contact of FIG. 1 after a tungsten deposition that forms a key hole in the contact.
Figure 3:
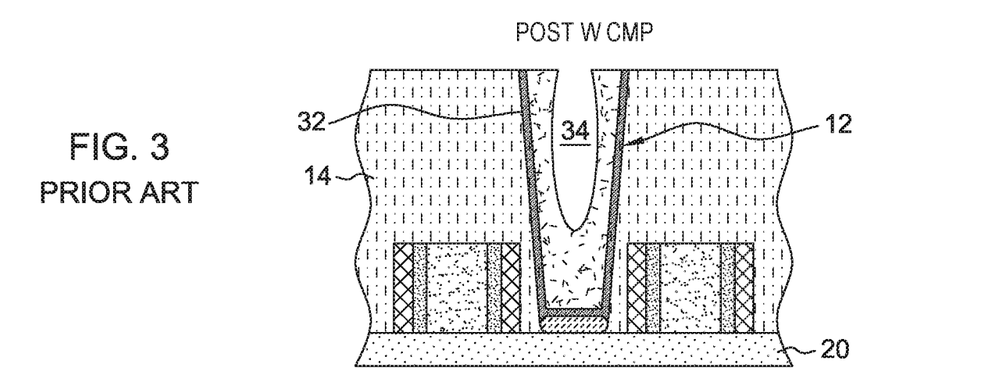
FIG. 3 is a schematic view of the contact of FIG. 2 after upper portions of the tungsten have been removed.

FIGS. 2 and 3 illustrate that, even where the contact opening 12 is not completely pinched off during deposition of the titanium 24, the metal cusp 30 is problematic during later contact fill steps. FIG. 2 shows the result of a deposition of a CVD tungsten layer 32. CVD tungsten is generally much more conformal than the PVD titanium 24. Nevertheless, even the CVD tungsten layer 32 cannot completely fill the contact opening 12 with a large cusp 30 shadowing the contact opening. A large void 34 thus forms within the plug, reducing the effective size of current flow path for the operational circuit. As aspect ratios of such contacts continually increase with each new generation of microchip, the risk of pinching off the contact opening also increases.

As shown in FIG. 3, this void 34 may become exposed after the upper portions of the tungsten 32 and metal layer 22 have been removed by, for example, chemical-mechanical polishing (CMP).

In accordance with embodiments of the invention, FIGS. 4-11 illustrate a method for forming contacts, and a contact made by that method, that significantly reduces the formation of keyholes in the contacts.

Figure 4:
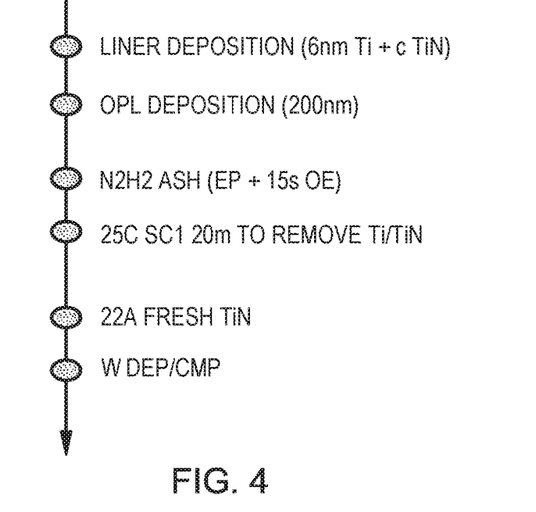
FIG. 4 illustrates a procedure for forming an electrical contact in an embodiment of the invention.

Generally, with reference to FIG. 4, embodiments of the invention comprise an initial Ti/TiN deposition in the contact opening to form a liner, an organic underlayer deposition in the contact opening, an organic underlayer ash to recess the organic underlayer in the contact opening, a fresh TiN deposition to re-line the upper portion of the contact opening, and a tungsten deposition and CMP to form a conductive plug in the contact opening. Each of these aspects is discussed in more detail below.

Figure 5:
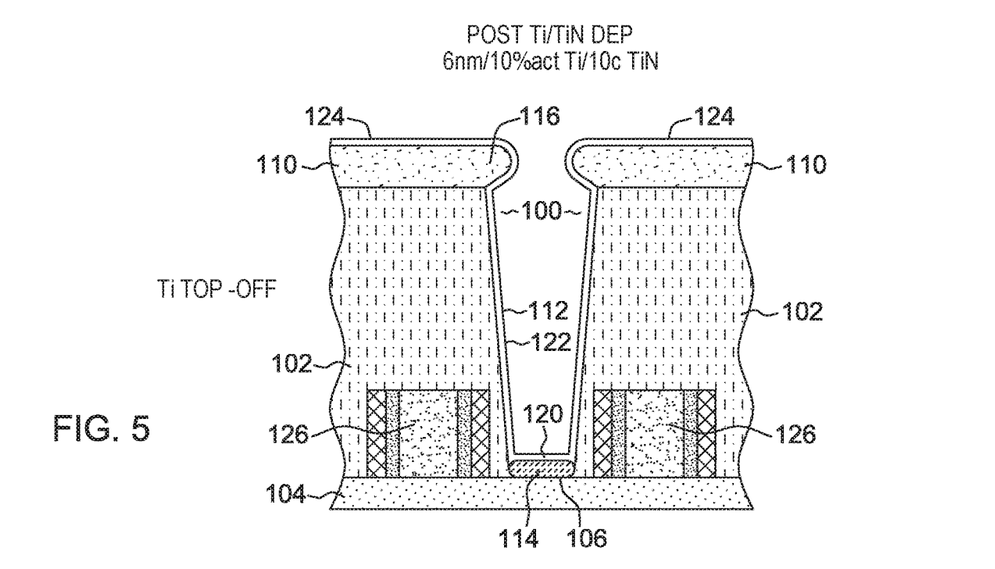
FIG. 5 is a schematic view of a partially fabricated contact in an integrated circuit after a Ti/TiN deposition.

FIG. 5 shows a contact opening 100 formed through a relatively thick insulating layer 102. Contact opening 100 extends down to a surface of a semiconductor substrate 104, and in particular, the contact opening extends to an active area 106 of the substrate. FIG. 5 also shows a metal layer 110 and a liner 112.

It will be understood that the contact opening 100 generally conforms to a cylindrical or tapered cylindrical shape with a circular shape at the top of the cylindrical opening. The drawings show a cross-sectional view of the contact opening 100, wherein the back wall is omitted from the views for simplicity. The insulating layer 102, which provides electrical isolation for the underlying devices, has a thickness between about 1.0 um (micron) and 3.0 um. The insulating layer 102 may comprise any suitable dielectric material, and as an example, comprises borophosphosilicate glass ("BPSG").

Metal layer 110 is deposited on insulating material 102 and into contact opening 100, and the metal layer forms a contact element 114 at the bottom of the contact opening 100, over active area 106 of substrate 104. As metal layer 110 is deposited, a cusp 116 forms at a top of the contact opening 100. Generally, the metal layer 110 is formed by a physical vapor deposition ("PVD"), or sputtering. As discussed above, PVD methods are especially prone to formation of a metal cusp 116 or overhang at the top of the contact opening 100.

Liner 112 lines the sidewalls of the contact opening 100, extends over contact element 114, and also extends over the metal layer 110 above the insulating layer 102. The initial conductive liner 112 thus comprises a substrate coating 120, a sidewall portion 122 and a top layer 124. Preferably, the conductive layer 112 comprises a metal which forms a stable, low-resistance silicide when reacted with silicon. Examples include refractory metals such as titanium, cobalt, tantalum, molybdenum, rhenium, and combinations of such metals. In some embodiments, the conductive layer 112 comprises titanium. The bottom layer or substrate coating 120 may be, for instance, formed of at least about 100 Å of titanium above the substrate surface 106, at the bottom of the contact opening 100.

The semiconductor substrate 104 may, for example, comprise monocrystalline silicon. It will be understood by one of skill in the art of semiconductor processing, however, that the substrate in alternative embodiments may comprise other forms of semiconductor layers which include active or operable portions of semiconductor devices. With the embodiment illustrated in FIG. 5, the active area 106 defined in the substrate 104 is between two gate electrodes 126. Such an active area may serve as the source or drain of a transistor in a dynamic random access memory (DRAM) chip, for example.

As the dimensions in integrated circuits continue to be scaled down, the size of active area 106 continues to decrease. As a result, the width of the contact opening 100 may range from about 0.2 um to 0.8 um, and the contact opening 100 may have an aspect ratio between about 2:1 and 8:1.

Figure 6:
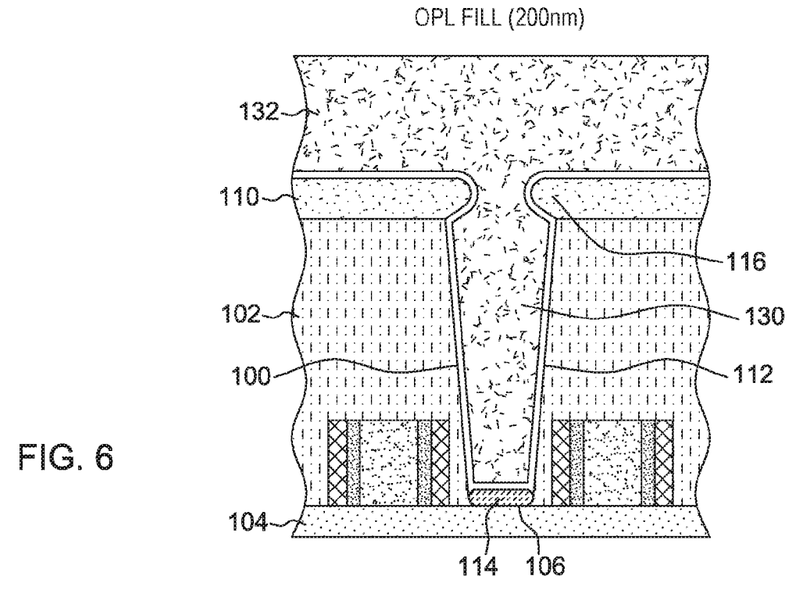
FIG. 6 is a schematic view of the contact of FIG. 5 after an organic underlayer fill.

As illustrated in FIG. 6, in embodiments of the invention, the formation of the conductive layer 112 is followed by an organic underlayer fill 130. The organic underlayer 130 fills the contact opening 100 and the neck formed by cusp 116, and the organic underlayer forms an upper layer 132 on the metal layer 110. Layer 132 is usually two to three times the height of the contact formed in opening 100. For example, upper layer 132 may have a thickness of about 200 nm. The thickness of layer 132 may be 300 nm, or thinner than 200 nm, depending on the viscosity and other features of the material used.

Figure 7:
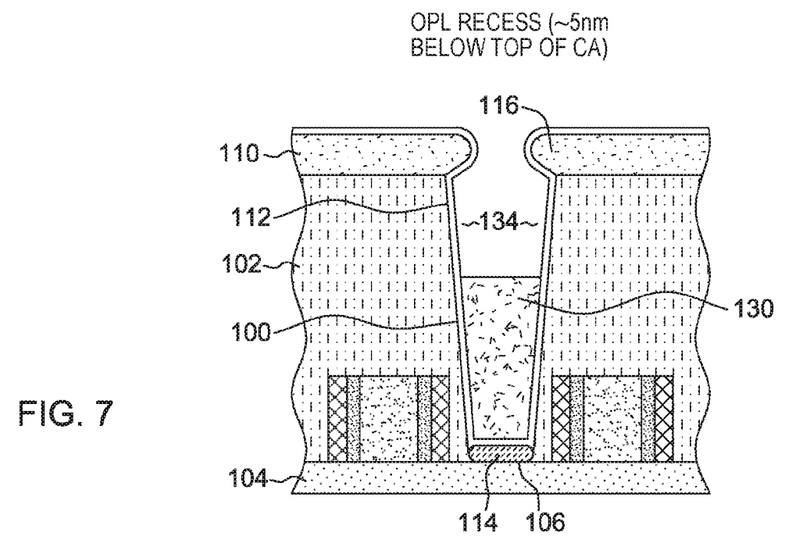
FIG. 7 shows the contact of FIG. 6 after recessing the organic underlayer fill.

With reference to FIG. 7, after the organic underlayer fill, the fill 130 is recessed, as shown at 134, for example by an organic underlayer ash. In embodiments of the invention, the recess 134 should be below the cusp 116, and in some embodiments, it may be preferred to recess the fill 130 below the final contact height, which is determined with a chemical mechanical polish process, to reduce the contact resistance with less liner material at the top of the contact opening. As an example, the fill 130 may be recessed to a level approximately 50 nm below the top of the contact opening 100. Any suitable removal procedure or technique may be used to recess the fill 130.

After the organic underlayer ash, a Ti/TiN etch is performed to remove portions of the Ti/TiN layer 112 above the remaining organic underlayer fill 130. This etch also removes cusp 116, leaving the structure shown in FIG. 8. Any suitable Ti/TiN removal or etching process may be used in this removal process.

Figure 8:
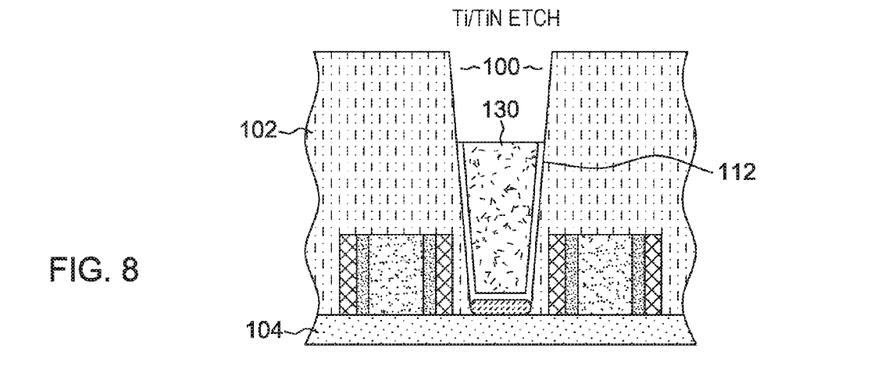
FIG. 8 is a view of the contact of FIG. 7 after a Ti/TiN etch.
Figure 9:
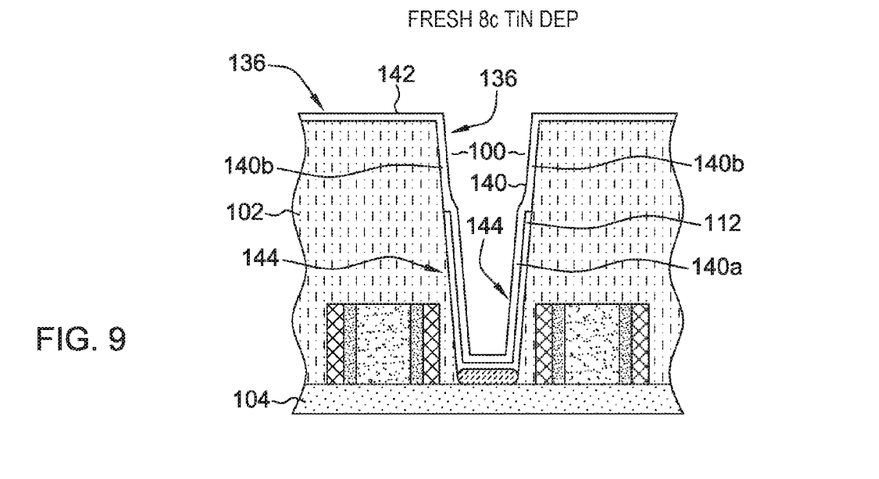
FIG. 9 illustrates the contact of FIG. 8 after a fresh TiN deposit.

With reference to FIGS. 8 and. 9, after the Ti/TiN etch, the remaining portion of the organic underlayer fill 130 in the contact opening 100 is removed and a fresh layer of TiN 136 is deposited within the contact opening 100, over and above the remaining portion of initial liner 112, forming liner 140 and top layer portion 142.

The filler material 130 can be etched and removed by a RIE etch process (such as a process using N2/H2 chemistry), or a wet etch which is selective to the metal/stack underneath, or a combination of RIE and wet etch. Since the filler material is not limited to a specific material (preferably an organic planarization layer, but not limited to that), the RIE/wet etch can be any suitable process selectively removing the filler material to other structures preexisting.

In this fresh deposit of TiN, the whole of opening 100 is lined with the fresh TiN deposit, forming liner 140. The fresh layer of TiN 136 deposited within the contact opening 100 forms a lower liner portion 140a over and against the remaining portions of initial liner 112, and forms upper liner portion 140b over and against upper areas of the sidewalls of the insulating layer 102 that form the contact opening 100 above liner 112. In this way, initial liner 112 and the fresh liner 140a of TiN form a double liner 144 lining the bottom portion of opening 100. Double liner 144 is thicker (since it is a double liner) than the upper liner portion 140b. As shown in FIG. 9, outside of opening 100, the fresh TiN deposit also forms a top layer portion 142 extending over insulating material 102.

Figure 10:
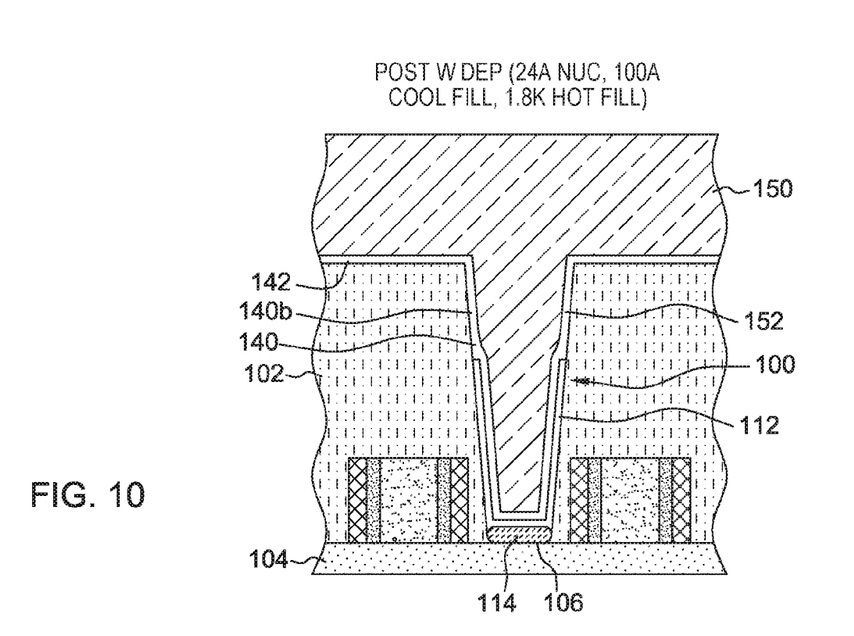
FIG. 10 shows the contact of FIG. 9 after a tungsten deposit to fill the contact.

Referring now to FIG. 10, a contact fill, comprising the deposition of a filler material 150, results in a conductive plug 152 filling the contact opening 100. The filler material 150 may comprise any conductive material for which conformal deposition processes are available. For example, CVD processes are known for tungsten (W), aluminum (Al), and copper (Cu). Other examples include PVD Al, which is forced into the contact opening at high pressure and temperature (e.g., 600 atm. and 450-500° C.) after deposition. In embodiments of the invention, tungsten is deposited by a known CVD process. As a result of the previous cusp removal, the conductive plug 152 is less likely to form keyholes or voids.

As FIG. 10 illustrates, the resulting structure may include a portion of the layer 142 that is above the top surface of the insulating layer 102. In addition, within the contact opening, liner 140 and liner 112 are interposed between the filler 150 and the insulating layer 102. It will be understood that in other embodiments that do not have the layer portion 142 on insulating layer 102, the filler material 150 may directly contact the top surface of the insulating layer.

Figure 11:
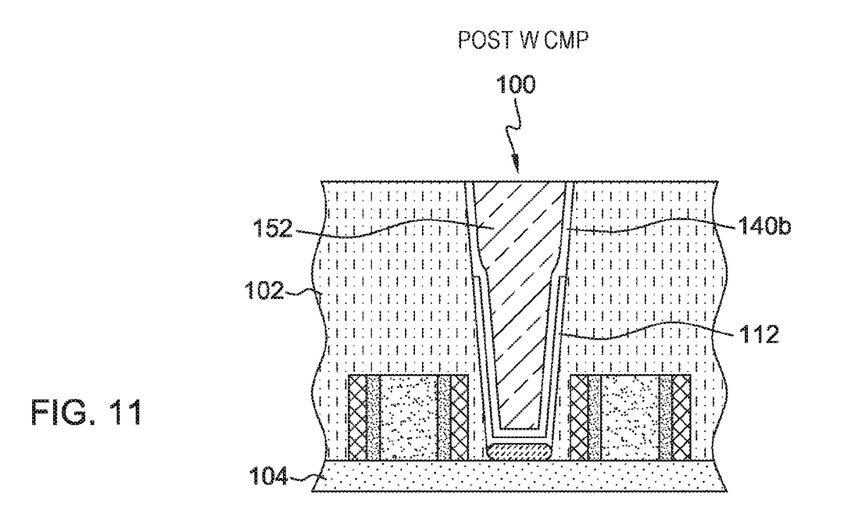
FIG. 11 is a view of the contact of FIG. 10 after removing upper portions of the tungsten.

After the tungsten fill, the upper portion of the tungsten 150 is removed, producing the structure shown in FIG. 11. Any suitable process may be used to remove the tungsten, and for example, a chemical mechanical polish may be used.

Figure 12:
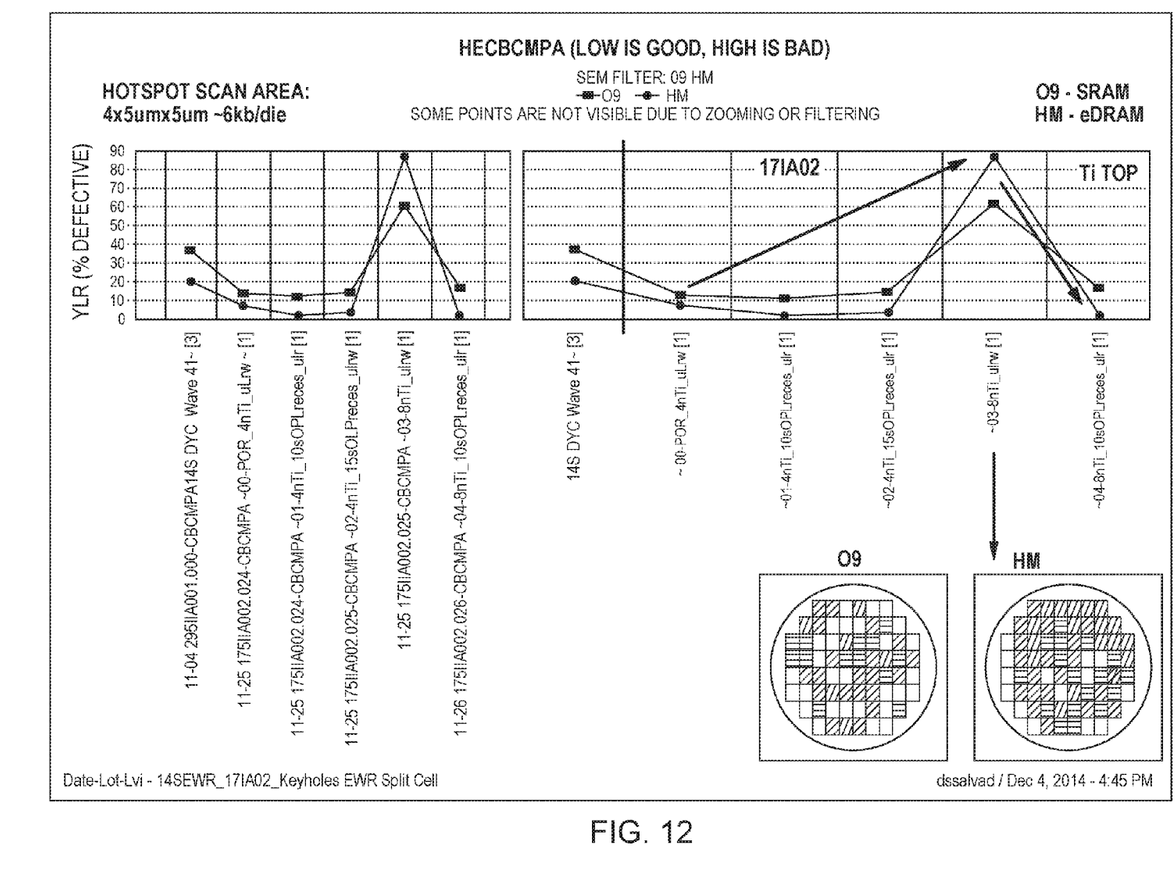
FIG. 12 is a graph comparing contacts made using several prior art techniques with contacts made using embodiments of this invention that have keyholes.

Embodiments of the invention significantly reduce the number of internal voids, or keyholes, in the tungsten fill. FIG. 12 shows a comparison of contacts made using a number of known techniques with contacts made using embodiments of this invention, and more particularly, this Fig. shows a comparison of percentages of the former contacts that have internal voids, or keyholes, with percentages of the latter contacts that have internal voids or keyholes.

The description of the invention has been presented for purposes of illustration and description, and is not intended to be exhaustive or to limit the invention in the form disclosed. Many modifications and variations will be apparent to those of ordinary skill in the art without departing from the scope of the invention. The embodiments were chosen and described in order to explain the principles and applications of the invention, and to enable others of ordinary skill in the art to understand the invention. The invention may be implemented in various embodiments with various modifications as are suited to a particular contemplated use.

The invention claimed is:

1. A method of forming an electrical contact in an integrated circuit, the integrated circuit comprising a substrate, an insulating layer on the substrate, and a metal layer on the insulating layer, wherein the substrate has an active area, an opening is formed through the insulating layer to expose the active area of the substrate, said opening having a bottom end adjacent said active area and a top end spaced from said active area by a thickness of said insulating layer, and the metal layer forms a cusp at the top end of said opening causing a narrowing of said opening at said top end, the method comprising:
    depositing an initial conductive layer in the opening of the insulating layer to form a liner against a sidewall surface of the insulating layer and against said active area;
    applying a filler material inside said opening to protect a portion of said liner that is below a level of the cusp;
    removing the cusp to widen said opening while said filler material protecting said portion of said liner covered thereby;
    removing said filler material from said opening to expose said portion of said liner;
    re-lining said opening in the insulating layer with a further conductive layer; and
    filling the opening in the insulating layer with a conductive material to form an electrically conductive contact extending through the insulating layer.

2. The method according to claim 1, wherein applying said filler material inside said opening to protect said portion of said liner comprises:
    filling said opening with said filler material above said level of said cusp; and
    recessing said filler material through etching to a level below said level of said cusp.

3. The method according to claim 1, wherein:
    applying said filler material inside said opening to protect said portion of said liner comprises filling said opening with an organic underlayer filler wherein said organic underlayer filler being said filler material; and wherein
    removing said filler material from said opening to expose said portion of said liner comprises conducting an organic underlayer ash to remove a portion of the organic underlayer filler.

4. The method according to claim 1, wherein:
    depositing said initial conductive layer in the opening of the insulating layer includes depositing the initial conductive layer in said opening to form a contact area on a metal contact element on the active area of the substrate at the bottom end of the opening in the insulating layer.

5. The method according to claim 1, wherein removing the cusp to widen said opening while said filler material protecting said portion of said liner covered thereby comprises removing the metal layer on the insulating layer to remove the cusp.

6. The method according to claim 5, wherein:
    depositing an initial conductive layer in the opening of the insulating layer to form a liner against a sidewall surface of the insulating layer includes forming a portion of the initial conductive layer over the metal layer; and wherein
    removing the metal layer on the insulating layer includes removing the portion of the initial conductive layer over the metal layer.

7. The method according to claim 6, wherein filling the opening in the insulating layer with a conductive material includes depositing a portion of the conductive material above a top surface of the insulating layer.

8. The method according to claim 7, further comprising removing said portion of the conductive material above the top surface of the insulating layer.

9. The method according to claim 5, wherein removing the metal layer on the insulating layer includes using an etching process to remove the metal layer, including the cusp, on the insulating layer.

10. The method according to claim 1, wherein:
the initial conductive layer is Ti/TiN;
the further conductive layer is Ti/TiN; and
the conductive material is tungsten.

11. A method of forming an electrical contact in an integrated circuit, the integrated circuit comprising a substrate, an insulating layer on the substrate, and a metal layer on the insulating layer, wherein the substrate has an active area, an opening is formed through the insulating layer to expose the active area of the substrate, said opening having a bottom end adjacent said active area and a top end spaced from said active area by a thickness of said insulating layer, and the metal layer forms a cusp at the top end of said opening causing a narrowing of said opening at said top end, the method comprising:
  forming a contact element on said contact area in the opening of the insulating layer;
  forming an initial conductive liner in the opening of the insulating layer, against a sidewall surface of the insulating layer, said initial conductive liner forming a contact surface area above the contact element, and extending upward from a lower portion of said opening;
  applying an organic underlayer filler inside said opening to protect a portion of said liner that is below a level of the cusp;
  removing the metal layer above the insulating layer, including removing the cusp to widen said opening while said organic underlayer filler protecting said portion of said initial conductive liner covered thereby;
  removing the organic underlayer fill from the opening in the insulating layer to expose said portion of said initial conductive liner;
  re-lining said opening with a further conductive liner; and
  filling the opening in the insulating layer with a conductive material to form an electrically conductive contact extending through the insulating layer to the contact surface area of the initial conductive liner.

12. The method according to claim 11, wherein applying an organic underlayer filler inside said opening to protect a portion of said liner comprises filling said opening with said organic underlayer filler to a level above the cusp.

13. The method according to claim 12, wherein removing the organic underlayer fill from the opening in the insulating layer to expose said portion of said liner includes recessing said organic underlayer fill to a level below the cusp.

14. The method according to claim 11, wherein removing the organic underlayer filler from the opening in the insulating layer to expose said portion of said liner covered thereby includes performing an organic underlayer ash to remove the organic underlayer filler.

15. The method according to claim 11, wherein the re-lining said opening with a further conductive liner includes applying the further conductive liner over and against the initial conductive liner.

* * * * *